United States Patent [19]
Beausoleil et al.

[11] Patent Number: 6,051,030
[45] Date of Patent: Apr. 18, 2000

[54] EMULATION MODULE HAVING PLANAR ARRAY ORGANIZATION

[75] Inventors: William F. Beausoleil, Hopewell Junction; Tak-Kwong Ng, Hyde Park, both of N.Y.

[73] Assignee: International Business Machines Corporation, Armonk, N.Y.

[21] Appl. No.: 09/052,417

[22] Filed: Mar. 31, 1998

[51] Int. Cl.[7] .................................................. G06F 3/00
[52] U.S. Cl. .............................. 703/28; 703/27; 703/20
[58] Field of Search ..................... 395/500.44, 500.47, 395/500.48, 500.49, 500.02, 500.18; 703/20, 27, 28

[56] References Cited

U.S. PATENT DOCUMENTS

| | | | |
|---|---|---|---|
| 4,434,462 | 2/1984 | Guttag et al. | 364/200 |
| 4,933,577 | 6/1990 | Wong et al. | 307/465 |
| 5,551,013 | 8/1996 | Beausoleil et al. | 395/500 |
| 5,557,217 | 9/1996 | Pedersen | 326/36 |
| 5,566,344 | 10/1996 | Hall et al. | 395/800 |
| 5,761,484 | 6/1998 | Agarwal et al. | 395/500 |
| 5,801,715 | 9/1998 | Norman | 345/505 |
| 5,850,537 | 12/1998 | Selvidge et al. | 395/500 |

OTHER PUBLICATIONS

Quickturn CoBALT Emulation System Brochure, Quickturn Design Systems, Inc., Copyright may 1997. (4 pages total).

*Primary Examiner*—Kevin J. Teska
*Assistant Examiner*—Thai Phan
*Attorney, Agent, or Firm*—Lynn L. Augspurger

[57] ABSTRACT

Emulation modules containing an increased number of emulation processors are logically reconfigured into a plurality of planes which are interconnected by means of multiplexors to avoid I/O pinout complexities introduced by the increase in the number of emulation processors. The emulation processors present on an emulation module chip or board are partitioned into a plurality N of different planes or arrays which are interconnected with one another and with off-chip or off-board components via N-way multiplexors. One set of multiplexors provides an input function for each of the planes. Another N-way multiplexor provides output functionality for these same set of planes. An output driver for off-board or chip communication is connected to an N-way output multiplexor. Likewise, an input receiver receives input from off-chip or off-board sources and supplies this signal to all of the N-way multiplexors which provide input signals to the various arrays of emulation processors. In this way, emulation engines are increased in capacity with virtually no impact on chip or module pinout connection problems.

5 Claims, 8 Drawing Sheets

EMULATION MODULE HAVING PLANAR ARRAY ORGANIZATION

BACKGROUND OF THE INVENTION

The present invention is generally directed to the architecture and construction of machines which emulate electronic circuits. More particularly, the present invention is directed to an emulation engine in which individual emulation processors are configured in distinct planes or arrays and which are coupled to one another by means of multiplexor circuits. Individual emulation processors are organized in a fashion which solves problems associated with circuit density and input/output pin limitations.

The usefulness of emulation devices has increased enormously with growth in the complexity of integrated circuits. Basically, an emulation engine operates to mimic the logical design of a set of one or more integrated circuit chips. The emulation of these chips in terms of their logical design is highly desirable for several reasons which are discussed in more detail below. It is, however, noted that the utilization of emulation engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well mated to the utilization of emulation engines which are electrically configured to duplicate the same logic function that is provided by a design automation tool.

Utilization of emulation devices permits testing and verification via electrical circuits of logic designs before these designs are committed to a so-called "silicon foundry" for manufacture. The input to such foundries is the functional logic description required for the chip and its output is initially a set of photolithographic masks which are then used in the manufacture of the desired electrical circuit chip device. However, it is noted that the construction of such masks and the initial production of circuit chips, which operate in accordance with the designed-for functional logic requirements, is expensive. Any passage of a given device having the prescribed logic functionality through such a foundry is an expensive and time consuming process which clearly should be undertaken only once. It is the purpose of emulation engines to ensure such a single passage from the functional logic design stage through to the stage of chip production via such a foundry.

Verifying that logic designs are correct in the early stage of chip manufacturing, therefore, is seen to eliminate the need for costly and time-consuming second passes through a silicon foundry. Emulation, therefore, provides two very significant advantages. Firstly, the proper verification of a functional logic design eliminates the need for a second costly passage through the foundry and, secondly, and just as importantly, getting the design "right the first time" means that the design does not have to be corrected in the foundry, and accordingly, production delays are therefore significantly reduced and the time to market for the particular technology and technological improvements embedded in the integrated circuit chip is greatly reduced, thus positively impacting the ability to deliver the most sophisticated of technological solutions to the consumer in as short a time as possible.

An additional advantage that emulation systems have is that they provide an electrical circuit device which makes possible the early validation of software which is meant to operate the chips that the emulator is mimicking. Thus, software can be designed, evaluated and tested well before the time when actual circuit chips become available. Additionally, emulation systems can also operate as simulator-accelerator devices thus providing a high-speed simulation platform.

Emulation engines generally contain an interconnected array of emulation processors (EP). Each emulation processor (hereinafter, also sometimes simply referred to as "processor") is programmed to evaluate a particular logic function (for example, AND, OR, XOR, NOT, NOR, NAND, etc.). The programmed processors, together as a connected unit, emulate the entire desired logic design. However, as integrated circuit designs grow in size, more emulation processors are required to accomplish the emulation task. The aim of the present invention is therefore to increase the capacity of emulation engines in order to meet the increasingly difficult task of emulating more and more complex circuits and logic functions. In particular, the present invention does so by increasing the number of emulation processors in each of its modules.

In particular, the present invention represents an improvement on an existing emulation engine referred to as the ET3.5 Model. Also, in particular, the improved model is described herein and is referred to as the ET3.7 Model.

In an emulation engine in which there are a plurality K of emulation processors, the ideal situation is to have each processor be capable of connection to any one of the other K−1 processors. However, as the number of emulation processors K increases, the total number of processor-to-processor connections increases substantially as the second power of K. In particular, a fully connected network of K processors requires K(K−1) processor-to-processor connections. In such a fully connected network, each processor has K−1 connections to the other processors. However, physical constraints, such as connector size and/or pin size, make it completely impractical to construct fully connected networks when the number K of processors is large. For example, a fully populated ET3.5 emulation engine contains 33,280 processors. To keep the interprocessor wiring practical in a device such as the ET3.5, the processors are clustered hierarchically. In particular, an ET3.5 system, as designed, can contain from 1 to 8 circuit boards; each circuit board contains 65 modules; and each module contains 64 emulation processors. The processor array within each module is fully connected. However, each module has only a single connection to each one of the other modules on the same board. Similarly, each board has only a relatively small number of connections to other boards in the system.

Emulation processors can be added to an emulation engine such as the ET3.5 at any level in the hierarchy (engine, board of module). However, processor addition at each level has an associated penalty. For example, adding a second ET3.5 engine doubles the capacity and the cost, but processor-to-processor connectivity grows by a factor of four and is furthermore limited by engine-to-engine cabling. Adding new boards to an ET3.5 emulation engine requires, furthermore, an updating of the technology, the power supply and the cooling systems as well as a rework of the physical packaging into different frames and/or cages. Putting more modules onto each board is impractical since boards in the existing ET3.5 technology are already stretching currently available technology in terms of board size, the number of layers and the number of nets present on the board. As a result of these limitations, the improvements provided by the present invention are directed to systems in which more emulation processors are fit into the same physical area in an emulation chip module.

However, simply increasing the number of emulation processors is not by itself a sufficient solution to the problem since, with every doubling of the number of emulation processors, there is a correspondingly significantly large increase in the number of input/output pins required to accommodate the processors on any given chip die. However, existing systems are already at their essential pinout limit in terms of pin size and pin spacing for the purpose of moving signals to and from the module. Thus, a four-fold increase in the number of processors would require a corresponding four-fold increase in the number of I/O pins for each module. This would, in turn, require major changes to the emulation boards. However, changing these emulation boards is very expensive. And furthermore, the circuit boards, as noted, are already the most advanced printed circuit boards that current technology can provide. Additionally, a four-fold increase in the number of processors would normally mean a sixteen-fold increase in the number of processor-to-processor interconnections.

For purposes of better understanding the structure and operation of emulation devices, U.S. Pat. No. 5,551,013 is hereby incorporated herein by reference.

SUMMARY OF THE INVENTION

In accordance with a preferred embodiment of the present invention, the number of emulation processors disposed on any given module can be increased, preferably by a factor of at least 4. The emulation processors are then grouped into what are effectively distinct and separate logical array processor planes (or arrays) existing on the same module. It is noted herein that the term "plane" and/or "array" as described herein are essentially logical structures. The arrays described herein are shown in some of the figures in three-dimensional configurations; however, this configuration is merely for purposes of illustration and is not meant to necessarily imply a stacked arrangement of 3-D configured emulation processors or emulation processor arrays. Furthermore, as indicated above, the number of emulation processors per module can be increased at least by a factor of four in the present invention (from 64 in ET3.5 to 256 in ET3.7). While logical partitioning of the modules into logical arrays of four per module is convenient for purposes of the exemplary discussion herein, it is noted that any number of processors may be deployed in partitioning the module.

It is therefore seen that an increase in the number of processors would normally require a corresponding increase in the number of input/output pins for each module. This, in turn, would require major changes to the circuit boards in an emulation system. Changing the emulation boards is very expensive and the boards are already the most advanced printed circuit board technology available. Accordingly, there is a problem associated with the desire and need to increase the power and complexity of emulation devices while, at the same time, keeping within the physical and technological limitations for pinout complexity and spacing.

In accordance with a preferred embodiment of the present invention, emulation processors within modules for emulation engines are logically arranged in a plurality of planes and coupled to multiplexors as a means for providing time multiplexing on the signal pins to solve problems associated with circuit density, complexity and pinout.

More particularly, an emulation module, in accordance with the present invention, includes a plurality N of arrays of emulation processors. Each of these arrays has M individual emulation processors. Each of the M individual emulation processors in each of the N arrays is associated with a set of N-1 corresponding emulation processors on each of the other N-1 distinct arrays. Here, the term "array" is being used in the same sense as the term "plane" above. An N-way input multiplexor is provided which corresponds to each of the M emulation processors on each of the N arrays resulting in a total of NM input multiplexors per module. Each of these N-way input multiplexors has an output which is connected to an input of its corresponding emulation processor and each N-way input multiplexor has, as N-1 of its N inputs, the outputs from the set of N-1 corresponding emulation processors in different planes or arrays. An input driver for each set of N N-way input multiplexors is provided. The outputs of these multiplexors are connected to corresponding emulation processors in the N distinct arrays, for a total of M of said input drivers. The outputs of at least some of these input drivers are connected as inputs to N distinct ones of the input multiplexors. An N-way output multiplexor for each of M sets of corresponding emulation processors is also provided for a total of M output multiplexors. Each of these output multiplexors has inputs from a set of N corresponding emulation processors in distinct arrays. And lastly, an output driver for each of the N-way output multiplexors is provided.

Alternatively, the preferred embodiment of the present invention is describable as a plurality N of arrays of emulation processors. The outputs from the emulation processors are provided to multiple N-way multiplexors which are enabled to connect the output of the emulation processor in one plane to the input of another corresponding emulation processor in a different plane. In this way, connectivity between emulation processors in distinct, logical planes is provided. In a similar fashion, the output from a plurality N of distinct emulation processors in distinct planes is also provided to an N-way multiplexor which selects one of N output signals to be provided to an off-module circuit through a driver. In this way, connectivity between different modules within the emulation apparatus is likewise provided.

Accordingly, it is an object of the present invention to construct circuit emulation devices having increased capacities.

It is also an object of the present invention to provide faster and more flexible circuit and system emulation capabilities.

It is also an object of the present invention to eliminate multiple passes through silicon foundry design cycles.

It is also an object of the present invention to increase the number of emulation processors within a given module in an emulation apparatus without significantly impacting other aspects of the emulation apparatus design including wiring, cooling, board design, pinout and packaging.

It is also an object of the present invention to provide flexibility in emulation apparatus architecture.

Lastly, but not limited hereto, it is an object of the present invention to provide an architecture for emulation systems which is capable of growth and expansion particularly in terms of the number of emulation processors that may be employed within a given module.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1A:
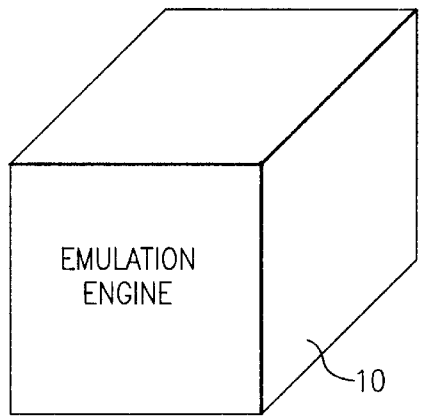
FIGS. 1A–1D illustrates, in sequentially greater detail, the hierarchical architecture of an emulation engine in functional block diagram form.
Figure 1B:
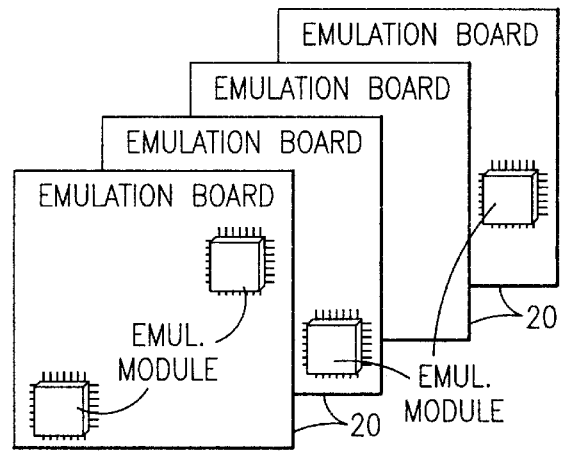
Figure 1C:
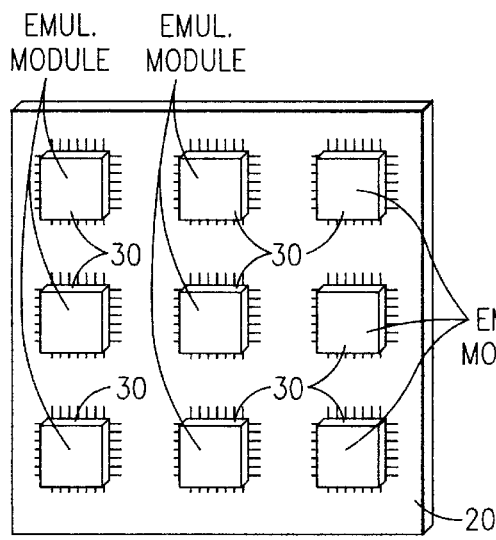
Figure 1D:
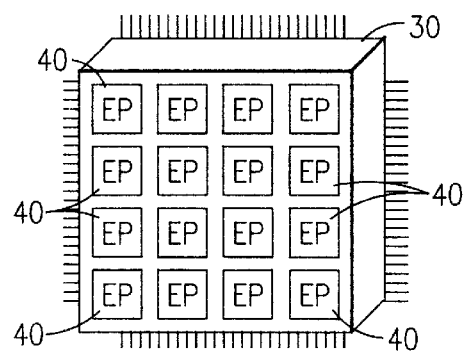

FIG. 1A illustrates, in functional block form, the highest hierarchical level for emulation engine 10. Emulation engine 10 includes a plurality of emulation boards 20, as shown in FIG. 1B. In turn, emulation boards 20 include a plurality of emulation modules 30. Emulation modules 30 comprise individual circuit chip components whose pinout spacing and pin numbers must be consider in the architecture of such engines. It is furthermore noted that each emulation module 30 includes a plurality of emulation processors 40. As described above, each emulation processor 40 is programmed to evaluate a particular logic function.

Figure 2A:
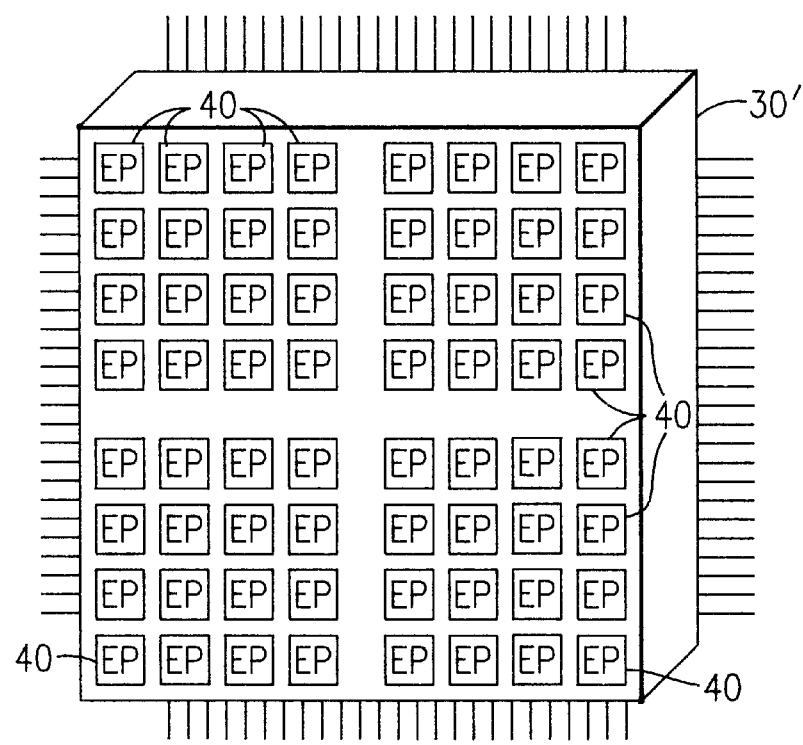
FIGS. 2A and 2B illustrates the pinout problem associated with a four-fold increase in the number of emulation processors per module.
Figure 2B:
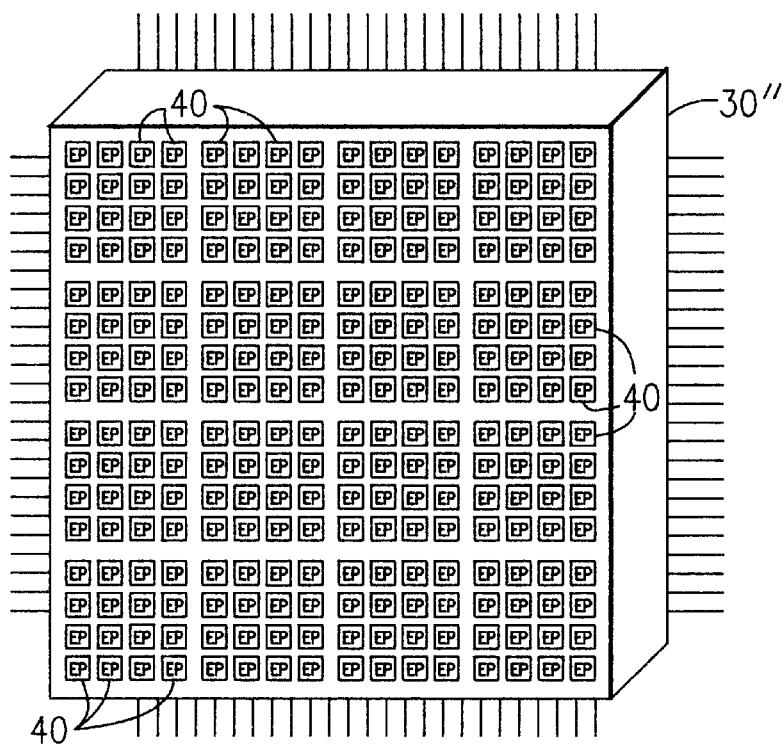
Figure 3:
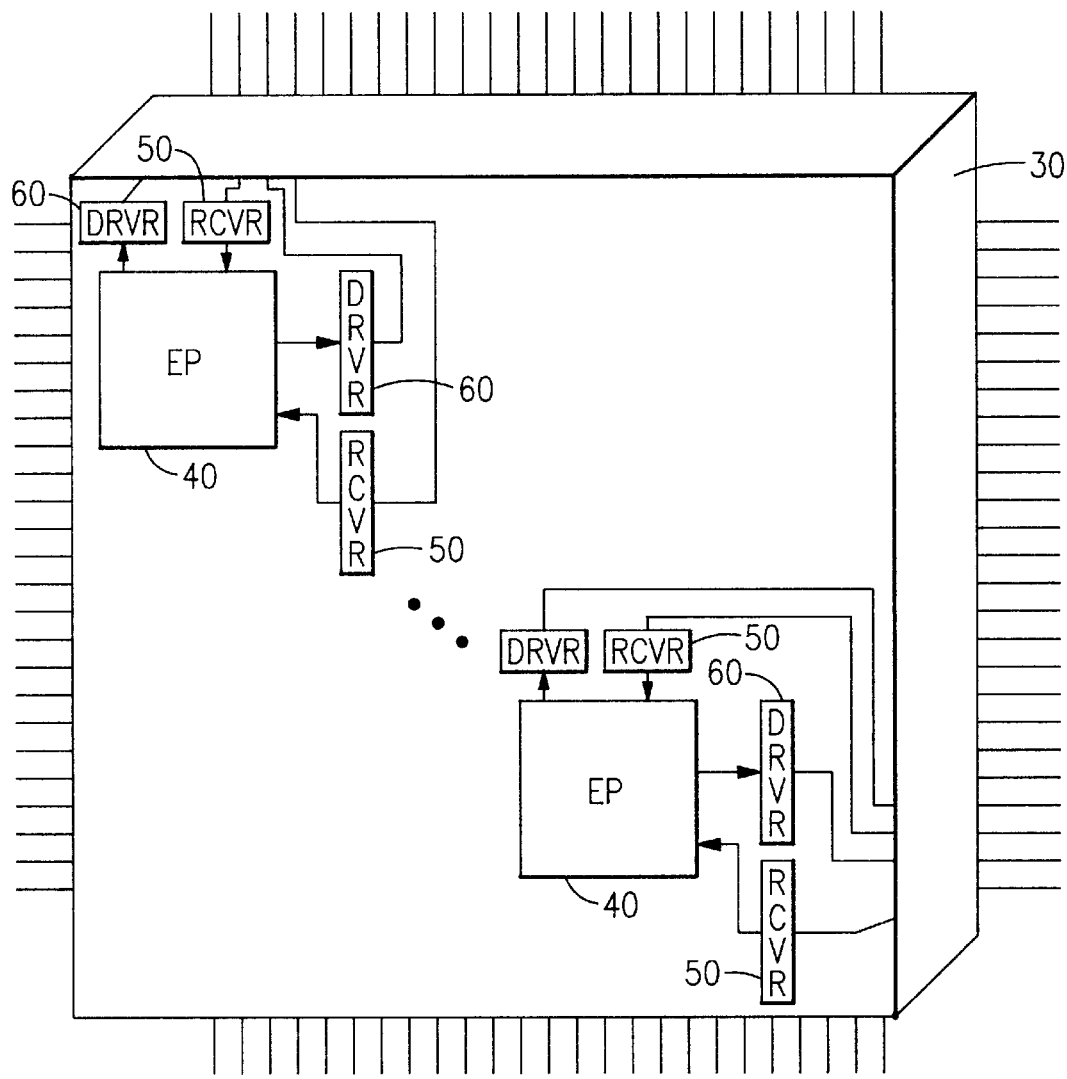
FIG. 3 illustrates the arrangement of drivers and receivers associated with individual ones of the emulation processors disposed on any given module.

As the technology of circuit chip design advances, the number of emulation processors that are present on a given module increases. For example, FIG. 2A illustrates an emulation module 30' which includes 64 emulation processors 40. With advances in circuit design and packaging, the number of emulation processors is now increased to 256 processors per module. Certainly increasing the number of processors per module is advantageous in terms of increasing the power and flexibility of an emulation engine; however, increasing the processor packaging density does not change the limited input/output pin spacing as is suggested in a comparison of FIGS. 2A and 2B. In point of fact, the interprocessor connection problem grows significantly worse with an increase in circuit packaging density. This situation is particularly understandable from an inspection of FIG. 3 herein wherein it is illustrated that emulation processors 40 ideally each include two input signal receivers 50 and two output drivers 60. Thus, on a module with 64 emulation processors with each having two input/output pairs, there are 128 drivers and 128 receivers for a combined total of 256 input/output pins per module. However, if one increases the number of emulation processors per module by a factor of four, it soon becomes apparent that the I/O pin requirements are increased by the same factor so as to reach a degree which makes it impossible to have enough space for getting signals off and onto the module.

Figure 4:
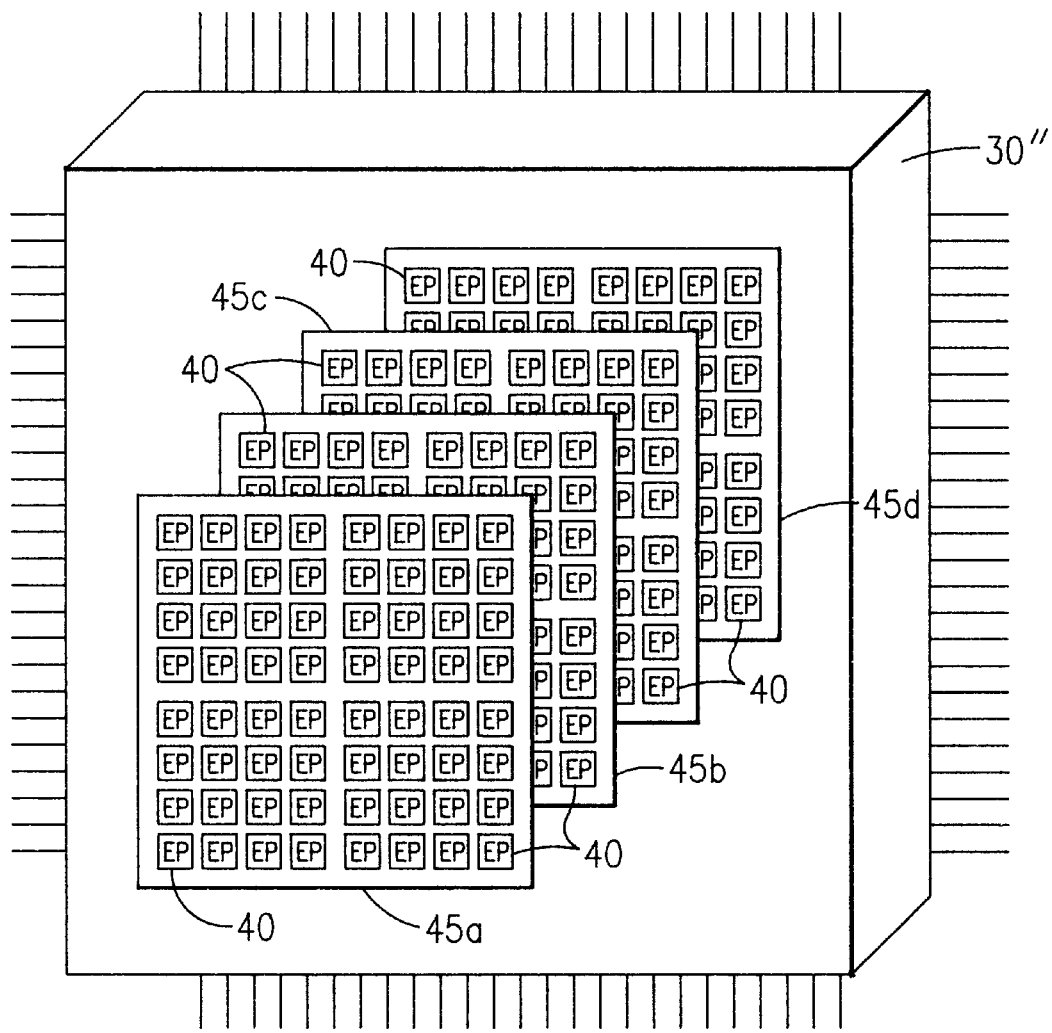
FIG. 4 illustrates, solely in logical and not necessarily physical form, the arrangement of emulation processor arrays as a mechanism for solving the input/output pin problem addressed in FIGS. 2A and 2B.

Accordingly, in accordance with the present invention, emulation processors on a module are organized into individual arrays. In particular, FIG. 4 illustrates the concept that these arrays of emulation processors are configured as logical (not necessarily physical) planes 45a, 45b, 45c, 45d, as shown. For purposes of understanding and description herein, these arrays also are referred to as "planes." Solely for purposes of illustration herein, it will be assumed that the emulation modules each contain 256 emulation processors and that these emulation processors 40 are configured as four logical planes or arrays of emulation processors labeled as Plane 0, Plane 1, Plane 2, and Plane 3, as illustrated in FIGS. 5–8 and as more particularly discussed below. Thus, for purposes of illustration, an exemplary emulation module contains 256 emulation processors configured in four arrays of 64 emulation processors each.

Figure 5:
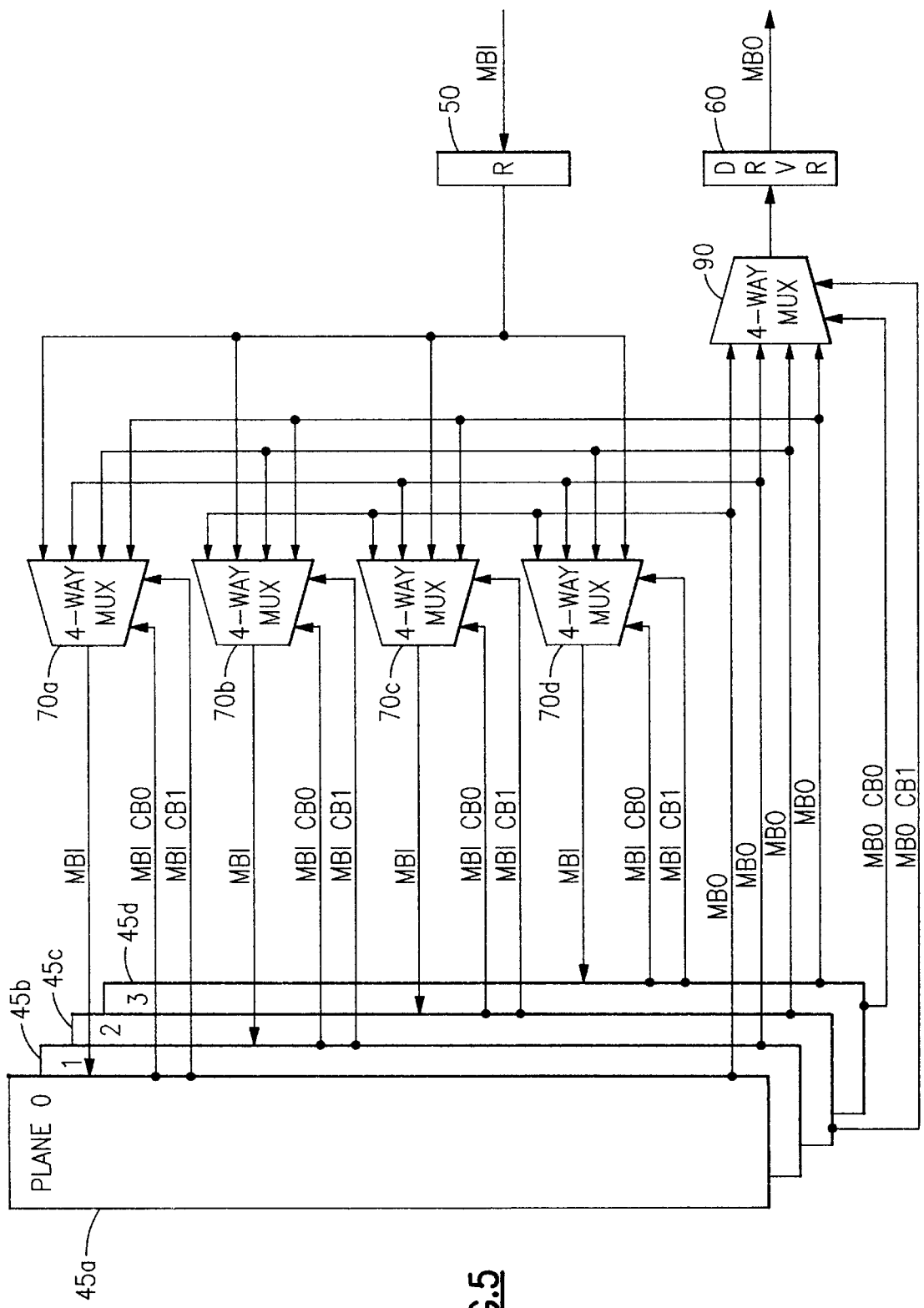
FIG. 5 illustrates, in functional block diagram form, a preferred embodiment of the present invention particularly showing the interconnection of arrays of emulation processors through interconnection by means of N-way multiplexors as a means for establishing communication paths between the planar arrays and between the planar arrays and off-module components.

FIG. 5 illustrates the mechanism of the present invention which is employed to relieve the architectural bottleneck created by increasing the number of emulation processors present on a given module. In particular, each logical plane of emulation processors 45a through 45d is connected so that each emulation processor in each plane has as its input the output from a N N-way multiplexor. In the present example, N=4. Focusing attention, solely for the sake of example, on multiplexor 70a, it is seen that this multiplexor acts as an input for an emulation processor 40 (note shown specifically) contained in Plane 0. This multiplexor has four inputs (in general, N inputs). Three of these inputs (generally, N−1 inputs) are provided from output signal lines from emulation processors on (N−1) other planes. Additionally, one other input to multiplexor 70a is provided from receiver 50. Thus, multiplexor 70a, in general, is an N-way multiplexor having N inputs. N−1 of these inputs come from the outputs of emulation processors 40 on other planes. The last input to the N-way multiplexor comes from an external source, namely, a source which is not on the same module. In the same way, N-way multiplexor 70b serves Plane 1, N-way multiplexor 70c serves Plane 2 and N-way multiplexor 70d serves Plane 3. This interconnection structure provides for processor interconnectivity within a module.

Additionally, it is noted that corresponding emulation processor output signal lines in different planes are supplied to N-way output multiplexor 90 whose output supplies driver 60. In general, N-way multiplexor 90 receives an output signal line from each of N emulation processors disposed in a different plane. Furthermore, in general, each plane is provided with M distinct emulation processors 40. Thus, each module includes a total of NM emulation processors configured in arrays or planes of M emulation processors each and arranged in N logical planes.

The selector bits for N-way multiplexor 70a are provided from emulation processor outputs control lines from Plane 0 (array 45a). Likewise, selector input signal lines for N-way multiplexors 70b, 70c and 70d are provided from Plane 1 (array 45b), Plane 2 (array 45c) and Plane 3 (array 45d), respectively, whose selector signal lines are provided from their corresponding planes as shown in FIG. 5. In general, there is flexibility in picking which of the N planes is used to provide selector signal lines for output multiplexor 90. The same is true for multiplexors 70a through 70d. In general, the selector bits sent to the multiplexors come from two of the four emulation processors that feed the multiplexor.

Figure 6:
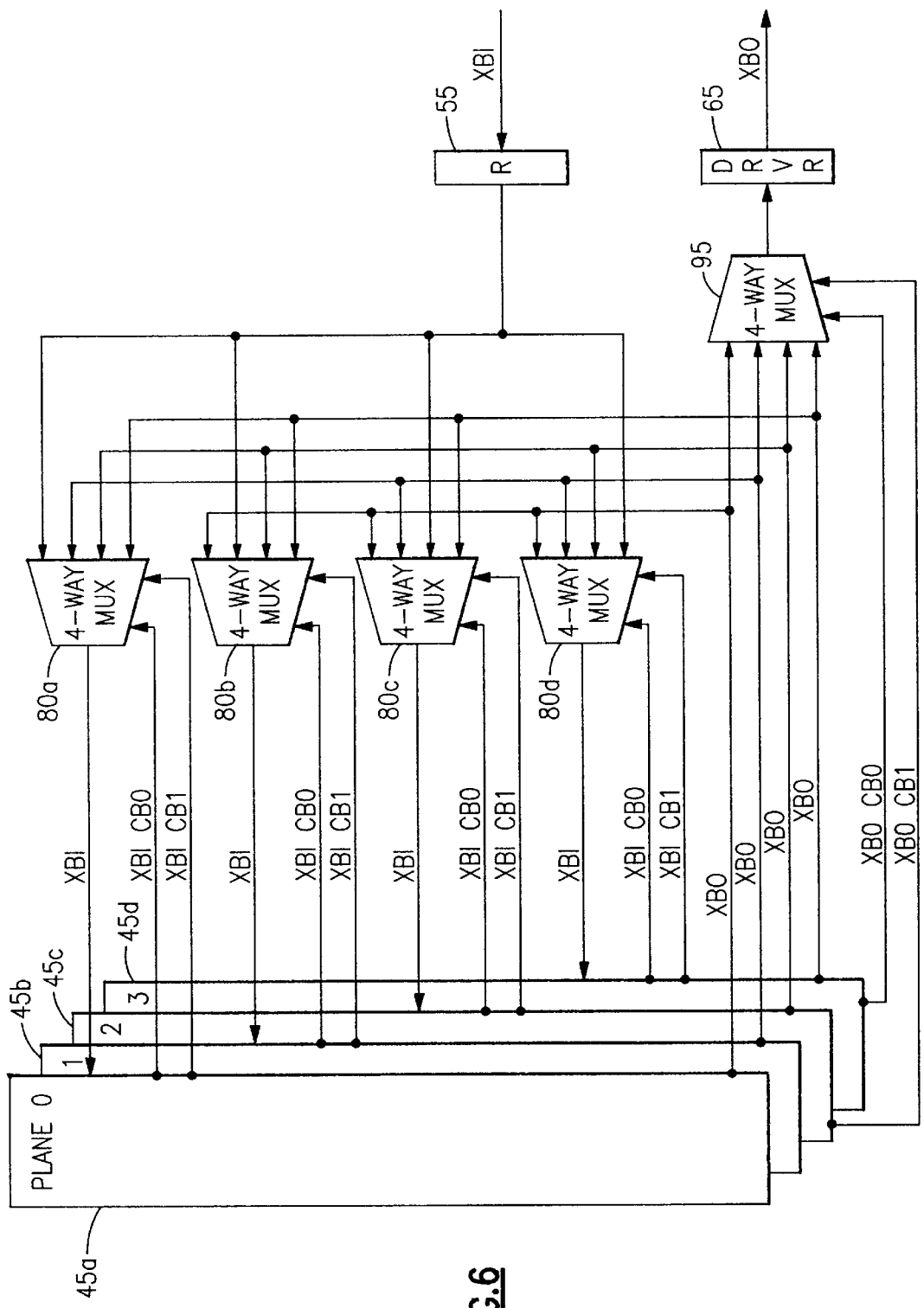
FIG. 6 is a diagram similar to FIG. 5 except more particularly illustrating the connection for the external bit bus as opposed to the module bit bus.

FIG. 6 is a logical block diagram similar to FIG. 5 except more particularly illustrating handling of the external bit bus line in accordance with the present invention in contrast to the module bit bus line shown in FIG. 5. Otherwise, the figures are the same. The external bit bus and the module bit bus signal lines shown in FIGS. 5 and 6 are both connected in the same fashion via the multiplexors shown. However, the module bit bus serves circuits contained on the module while the external bit bus signal lines across module boundaries.

Figure 7:
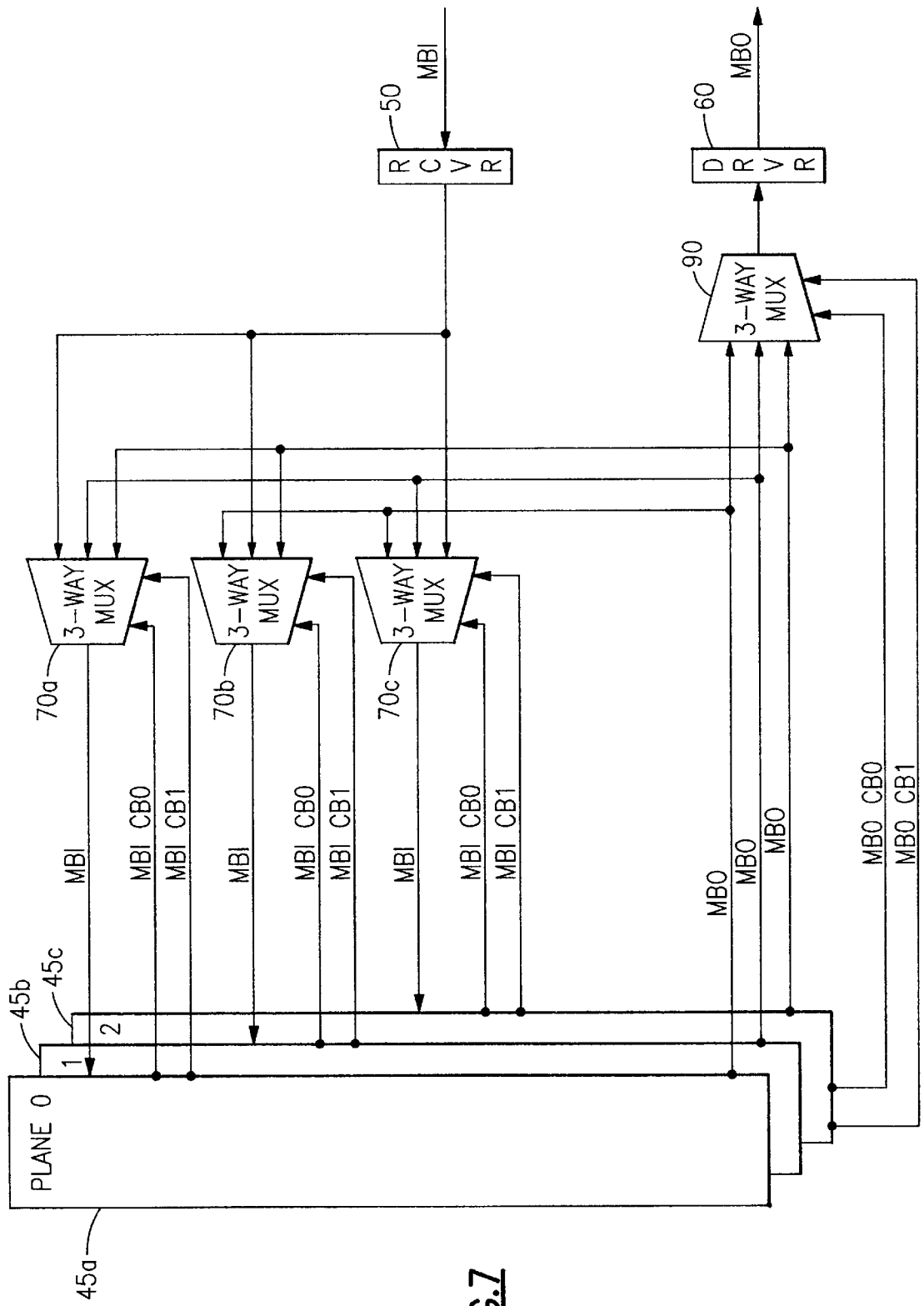
FIGS. 7 and 8 are similar to FIGS. 5 and 6 respectively except that FIGS. 7 and 8 more particularly illustrate flexibility in architecture where the module emulation processors are partitioned into three logical planar arrays as opposed to four.
Figure 8:
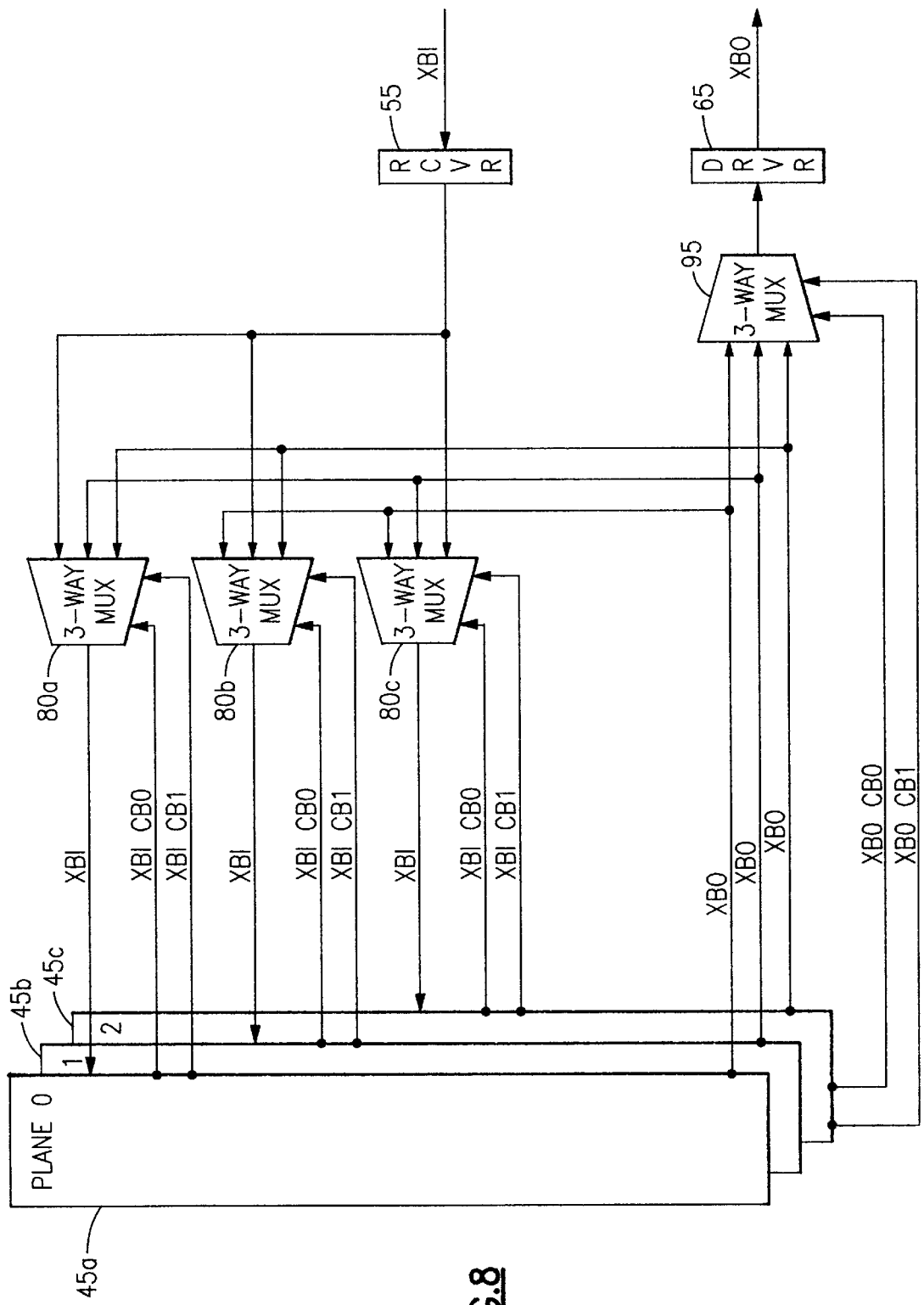

FIG. 7 is similar to FIG. 5 except that it illustrates the point that the present invention may be employed to partition a module in a different fashion. In particular, less than a full N-way partition can be effected. In particular, FIGS. 7 and 8 correspond exactly with FIGS. 5 and 6 in that they both illustrate the use of a 3-way multiplexor set for interconnection of module Planes 0, 1 and 2 (arrays 45a, 45b and 45c). In particular, output multiplexor 95 corresponds to output multiplexor 90, output driver 65 corresponds to output driver 60 and input receiver 55 corresponds to input receiver 50 in FIGS. 5 and 7.

In the interconnection circuit and method shown in FIGS. 5 through 8, individual emulation processors 40 are still independent. At any given step, each emulation processor runs its own program. An added benefit of the multiplexor configuration shown in FIGS. 5 through 8 is that there is provided a mechanism for a form of signal "broadcast," wherein the output of one processor is sent simultaneously both to a processor in another module via the driver and also to processors in up to N–1 planes on the same module.

With specific reference to FIGS. 5 through 8, and especially to FIGS. 5 and 6, it is noted that each receiver 50 feeds each one of the N N-way multiplexors (70a, . . . , 70d). However, in currently more preferred embodiments, it is noted that one can also employ more than one receiver with each such receiver supplying additional input signals to the N multiplexors. For each additional receiver, there is a corresponding increase in the number of data inputs to the multiplexors and additional input control signal lines whenever it is necessary. Likewise, a pair of output multiplexors 90 could supply a corresponding pair of output drivers 60. These multiplexors have the same data inputs but different output control signal lines. It is noted that, while the above discussion is particularly addressed to FIG. 5, the variations indicated also apply to the circuits of FIG. 6, which illustrate external bit bus connections.

From the above, it is seen that the objects set forth above are met by the invention described herein. In particular, the problem of increasing capacity without requiring major board modifications has been addressed. The solution provided herein requires absolutely no changes to the circuit board. New higher-capacity modules are provided which are pin compatible with existing modules. Furthermore, further improvements in technology in terms of circuit package density are also seen to be fully encompassed in the design improvement provided by the present invention. Additionally, the solution set forth herein does not require an increase in the number of internal board-to-board cables. This is advantageous since these cables tend to be expensive. Additionally, it is noted that the invention provided by the solution set forth herein also does not require any changes to the frame, power supplies, cooling system or physical racks associated with emulation systems. Even the power consumed by the improved system is lower than that of less dense systems since newer technologies operate at lower voltages and, correspondingly, lower power requirements in spite of the increased circuit packaging density. Additionally, no major changes are required in any of the software required to operate or drive an emulation engine. Only the question of the number of additional processors needs to be addressed. Additionally, there is no change required in any workstation that is used as an interface or front end for the emulation system disclosed herein.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An emulation module for use with like modules in an emulation engine system for verifying in the early stage of chip manufacturing that a functional design of a planned logic design is correct by mimicking the behavior of the planned logic design and for early validation of software which is meant to operate the function of the planned logic design that the emulation engine system is mimicking comprising:

a plurality N of arrays of emulation processors with each array having at least M individual emulation processors, wherein for each of said M emulation processors in each array there is a set of N–1 corresponding emulation processors in the other N–1 distinct arrays;

an N-way input multiplexor corresponding to each of said M emulation processors in each of said N arrays for a total of NM input multiplexors, with each said N-way input multiplexor having an output connected to an input of its corresponding emulation processor, and with each said N-way input multiplexor having, as N–1 of its N inputs, outputs from said set of N–1 corresponding emulation processors;

an input driver for each set of N N-way input multiplexors whose outputs are connected to corresponding emulation processors in N distinct arrays, for a total of M of said input drivers, with the output of at least some of said input drivers being connected as an input to N distinct ones of said input multiplexors which are connected to corresponding emulation processors in N distinct arrays;

an N-way output multiplexor for each of M sets of corresponding emulation processors, for a total of M output multiplexors, with each said N-way output multiplexor having inputs from a set of N corresponding emulation processors in distinct arrays; and an output driver for each of said N-way output multiplexors, said output drivers having as inputs the output from its corresponding output multiplexor.

2. The emulation module of claim 1 further including input selection control signal lines for at least some of said NM input multiplexors.

3. The emulation module of claim 2 in which said input selection control signal lines are supplied from the same array to which the output of said input multiplexors is connected.

4. The emulation module of claim 1 further including input selection control signal lines for at least some of said M output multiplexors.

5. The emulation module of claim 4 in which said selection control signal lines are supplied from distinct ones of said N arrays.

* * * * *